(12) United States Patent
Kizilyalli et al.

(10) Patent No.: US 9,502,544 B2
(45) Date of Patent: Nov. 22, 2016

(54) METHOD AND SYSTEM FOR PLANAR REGROWTH IN GAN ELECTRONIC DEVICES

(71) Applicant: AVOGY, INC., San Jose, CA (US)

(72) Inventors: Isik C. Kizilyalli, San Francisco, CA (US); Linda Romano, Sunnyvale, CA (US); David P. Bour, Cupertino, CA (US)

(73) Assignee: Avogy, Inc., San Jose, CA (US)

( * ) Notice: Subject to any disclaimer, the term of this patent is extended or adjusted under 35 U.S.C. 154(b) by 0 days.

(21) Appl. No.: 14/815,780

(22) Filed: Jul. 31, 2015

(65) Prior Publication Data

US 2015/0340476 A1    Nov. 26, 2015

Related U.S. Application Data

(63) Continuation of application No. 13/465,812, filed on May 7, 2012, now Pat. No. 9,117,839.

(51) Int. Cl.
| | | |
|---|---|---|
| *H01L 29/15* | (2006.01) | |
| *H01L 29/66* | (2006.01) | |
| *H01L 29/78* | (2006.01) | |
| *H01L 29/808* | (2006.01) | |
| *H01L 29/20* | (2006.01) | |

(52) U.S. Cl.
CPC ... *H01L 29/66924* (2013.01); *H01L 29/66446* (2013.01); *H01L 29/7832* (2013.01); *H01L 29/8083* (2013.01); *H01L 29/2003* (2013.01)

(58) Field of Classification Search
CPC ............. H01L 29/7832; H01L 29/66446; H01L 29/8083

USPC .................................................. 257/76, 263
See application file for complete search history.

(56) References Cited

U.S. PATENT DOCUMENTS

| 9,117,839 B2 | 8/2015 | Kizilyalli et al. |
| 2013/0146886 A1 | 6/2013 | Disney et al. |
| 2013/0292686 A1 | 11/2013 | Kizilyalli et al. |

OTHER PUBLICATIONS

Non-Final Office Action of May 9, 2014 for U.S. Appl. No. 13/465,812; 8 pages.
Final Office Action of Aug. 28, 2014 for U.S. Appl. No. 13/465,812; 8 pages.
Non-Final Office Action of Jan. 5, 2015 for U.S. Appl. No. 13/465,812; 7 pages.
Notice of Allowance of Apr. 23, 2015 for U.S. Appl. No. 13/465,812; 7 pages.

*Primary Examiner* — Douglas Menz
(74) *Attorney, Agent, or Firm* — Kilpatrick Townsend & Stockton LLP

(57) ABSTRACT

A vertical JFET includes a III-nitride substrate and a III-nitride epitaxial layer of a first conductivity type coupled to the III-nitride substrate. The first III-nitride epitaxial layer has a first dopant concentration. The vertical JFET also includes a III-nitride epitaxial structure coupled to the first III-nitride epitaxial layer. The III-nitride epitaxial structure includes a set of channels of the first conductivity type and having a second dopant concentration, a set of sources of the first conductivity type, having a third dopant concentration greater than the first dopant concentration, and each characterized by a contact surface, and a set of regrown gates interspersed between the set of channels. An upper surface of the set of regrown gates is substantially coplanar with the contact surfaces of the set of sources.

22 Claims, 7 Drawing Sheets

METHOD AND SYSTEM FOR PLANAR REGROWTH IN GAN ELECTRONIC DEVICES

CROSS-REFERENCES TO RELATED APPLICATIONS

This application is a continuation of U.S. patent application Ser. No. 13/465,812, filed on May 7, 2012, the disclosure of which is incorporated by reference herein in its entirety for all purposes.

BACKGROUND OF THE INVENTION

Power electronics are widely used in a variety of applications. Power electronic devices are commonly used in circuits to modify the form of electrical energy, for example, from ac to dc, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

The present invention relates generally to electronic devices. More specifically, the present invention relates to devices with substantially planar regrown regions. Merely by way of example, the invention has been applied to methods and systems for the selective regrowth of planar gallium-nitride (GaN) based epitaxial layers. The methods and techniques can be applied to a variety of compound semiconductor systems including vertical junction field effect transistors (JFETs), electrical contact structures, diode structures, and the like.

According to an embodiment of the present invention, a method for fabricating an electronic device is provided. The method includes providing a III-nitride substrate and forming a III-nitride epitaxial layer coupled to the III-nitride substrate. The III-nitride epitaxial layer has an upper surface and a thickness. The method also includes removing a predetermined portion of the III-nitride epitaxial layer to form one or more recessed regions extending from the upper surface to a predetermined depth into the III-nitride epitaxial layer and regrowing a III-nitride epitaxial material in the one or more recessed regions. The III-nitride epitaxial material has an upper regrowth surface substantially coplanar with the upper surface of the III-nitride epitaxial layer.

According to another embodiment of the present invention, a vertical JFET is provided. The vertical JFET includes a III-nitride substrate and a III-nitride epitaxial layer of a first conductivity type coupled to the III-nitride substrate. The first III-nitride epitaxial layer has a first dopant concentration. The vertical JFET also includes a III-nitride epitaxial structure coupled to the first III-nitride epitaxial layer. The III-nitride epitaxial structure includes a set of channels of the first conductivity type and having a second dopant concentration, a set of sources of the first conductivity type, having a third dopant concentration greater than the first dopant concentration, and each characterized by a contact surface, and a set of regrown gates interspersed between the set of channels. An upper surface of the set of regrown gates is substantially coplanar with the contact surfaces of the set of sources.

According to a specific embodiment of the present invention, a method of fabricating a vertical JFET is provided. The method includes providing a III-nitride substrate and forming a first III-nitride epitaxial layer of a first conductivity type coupled to the III-nitride substrate. The first III-nitride epitaxial layer has a first thickness. The method also includes forming one or more additional III-nitride epitaxial layers coupled to the first III-nitride epitaxial layer and removing a portion of the one or more additional III-nitride epitaxial layers to form a set of recesses extending a predetermined distance into the one or more additional III-nitride epitaxial layers. The set of recesses are disposed between remaining portions of the one or more additional III-nitride epitaxial layers. The method further includes regrowing an epitaxial material in the set of recesses. The epitaxial material has a thickness substantially equal to the predetermined distance. Additionally, the method includes forming a drain contact electrically coupled to the III-nitride substrate, forming a set of source contacts electrically coupled to the remaining portions of the one or more additional III-nitride epitaxial layers, and forming a set of gate contacts electrically coupled to the epitaxial material.

Numerous benefits are achieved by way of the present invention over conventional techniques. For example, embodiments of the present invention utilize an epitaxial regrowth process to produce planar device surfaces, improving lithography resolution and device yield. Additionally, embodiments of the present invention maximize active area and current-handling capability of electronic devices as well as improve yield and reliability. These and other embodiments of the invention, along with many of its advantages and features, are described in more detail in conjunction with the text below and attached figures.

DETAILED DESCRIPTION OF SPECIFIC EMBODIMENTS

Figure 1:
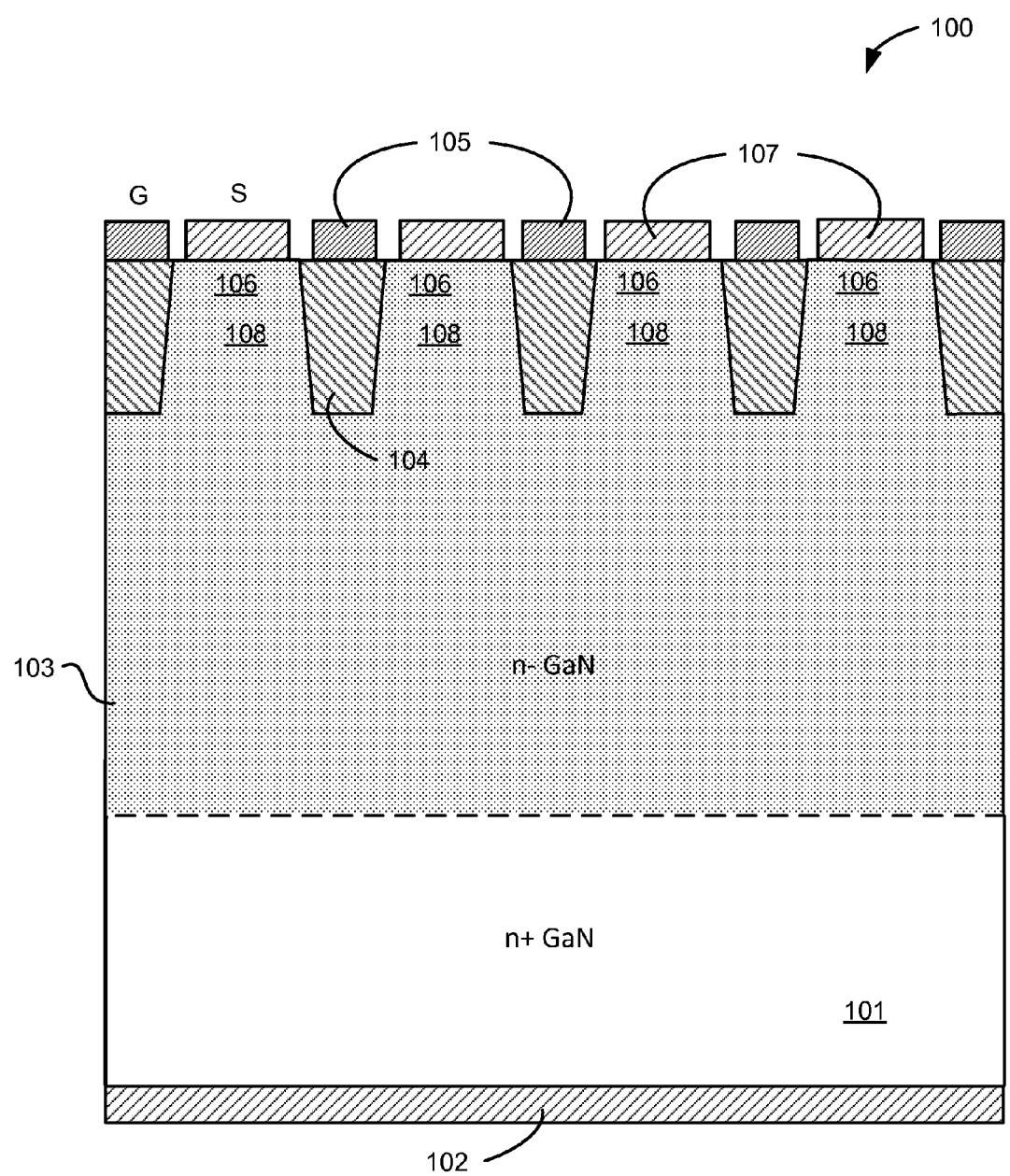
FIG. 1 is a simplified cross-sectional diagram illustrating a vertical JFET according to an embodiment of the present invention.

Embodiments of the present invention relate to electronic devices. More specifically, the present invention relates to devices with substantially planar regrown regions. Merely by way of example, the invention has been applied to methods and systems for the selective regrowth of planar gallium-nitride (GaN) based epitaxial layers. The methods and techniques can be applied to a variety of compound semiconductor systems including vertical junction field effect transistors (JFETs), electrical contact structures, diode structures, and the like.

GaN-based electronic and optoelectronic devices are undergoing rapid development. Desirable properties associated with GaN and related alloys and heterostructures include high bandgap energy for visible and ultraviolet light emission, favorable transport properties (e.g., high electron mobility and saturation velocity), a high breakdown field, and high thermal conductivity. According to embodiments of the present invention, gallium nitride (GaN) epitaxy on pseudo-bulk GaN substrates is utilized to fabricate vertical GaN-based semiconductor devices not possible using conventional techniques. For example, conventional methods of growing GaN include using a foreign substrate such as silicon carbide (SiC). This can limit the thickness of a usable GaN layer grown on the foreign substrate due to differences in thermal expansion coefficients and lattice constant between the GaN layer and the foreign substrate. High defect densities at the interface between GaN and the foreign substrate further complicate attempts to create vertical devices, including power electronic devices such as JFETs and other field-effect transistors.

Homoepitaxial GaN layers on bulk GaN substrates, on the other hand, are utilized in the embodiments described herein to provide superior properties to conventional techniques and devices. For instance, electron mobility, $\mu$, is higher for a given background doping level, N. This provides low resistivity, $\rho$, because resistivity is inversely proportional to electron mobility, as provided by equation (1):

$$\rho = \frac{1}{q\mu N}, \quad (1)$$

where q is the elementary charge.

Another superior property provided by homoepitaxial GaN layers on bulk GaN substrates is high critical electric field for avalanche breakdown. A high critical electric field allows a larger voltage to be supported over smaller length, L, than a material with a lower critical electric field. A smaller length for current to flow together with low resistivity give rise to a lower resistance, R, than other materials, since resistance can be determined by the equation:

$$R = \frac{\rho L}{A}, \quad (2)$$

where A is the cross-sectional area of the channel or current path.

In general, a tradeoff exists between the physical dimension of a device needed to support high voltage in a device's off-state and the ability to pass current through the same device with low resistance in the on-state. In many cases GaN is preferable over other materials in minimizing this tradeoff and maximizing performance. In addition, GaN layers grown on bulk GaN substrates have low defect density compared to layers grown on mismatched substrates. The low defect density will give rise to superior thermal conductivity, less trap-related effects such as dynamic on-resistance, and better reliability.

Among the vertical device structures contemplated is a vertical JFET. Depending on doping levels, physical dimensions, conductivity type (e.g., n-type or p-type materials), and other factors, vertical JFETs can be designed to have normally-off or normally-on functionality. A normally-off vertical JFET is particularly useful due to its ability to prevent current flow if no voltage is applied to the gate, which can serve as, among other things, a safety feature for vertical JFETs used in power applications.

A normally-off vertical JFET can be created in various ways. For example, an n-type current path from source to drain can be gated on either side by p+ gates. With sufficiently low background doping, and high positive charge due to high hole concentration in the p+ gates, the channel can be depleted of carriers, or pinched off at zero bias. When a positive voltage is applied to the gate(s), the channel can be re-opened to turn the device on. Thus, in embodiments of the present invention, the vertical JFET is referred to as a vertical junction field effect transistor since the current flows vertically between the source and drain through the gated region.

In addition to the ability to support high-voltage, low-resistance JFET applications, the GaN vertical JFETs described herein can differ from traditional vertical JFETs in other ways. For example, other semiconductors used to manufacture vertical JFETs, such as SiC can be utilized, altering the mode of manufacture. Furthermore, the use of GaN epitaxial layers can allow for non-uniform dopant concentrations as a function of thickness within the various layers of the vertical JFET, which can optimize the performance of the device.

FIG. 1 is a simplified cross-sectional diagram illustrating a vertical JFET 100 according to an embodiment of the present invention. Referring to FIG. 1, a drain 101 is provided. According to the embodiment of the present invention illustrated in FIG. 1, the substrate is an n-type GaN substrate, but the present invention is not limited to this particular material. In other embodiments, substrates with p-type doping are utilized. Additionally, although a GaN substrate is illustrated in FIG. 1A, embodiments of the present invention are not limited to GaN substrates. Other III-V materials, in particular, III-nitride materials, are included within the scope of the present invention and can be substituted not only for the illustrated GaN substrate, but also for other GaN-based layers and structures described herein. As examples, binary III-V (e.g., III-nitride) materials, ternary III-V (e.g., III-nitride) materials such as InGaN and AlGaN, and quaternary III-V (e.g., III-nitride) materials such as AlInGaN are included within the scope of the present invention. Additionally, embodiments can use materials having an opposite conductivity type to provide devices with different functionality. For example, embodiments provided herein focus on the formation of a JFET with an n-type drain and channel regions. However, a p-type JFET can be formed by using materials with opposite conductivity (e.g., substituting p-type materials for n-type materials, and vice versa) in a similar manner as will be evident to one of skill in the art.

Coupled to the substrate comprising the drain, is a drift region 103 of n-type GaN material. The drift region 103 provides a medium through which current can flow in the device's on-state in a vertical direction from the drain to a channel region 108 coupled to the drift region 103. In the off-state, the drift region provides a medium for supporting the electric field created by the voltage gradient between the source or gate and the drain. The channel region 108 also can comprise an n-type GaN material that is as wide as possible to minimize added resistance when the vertical JFET 100 is turned on, but narrow enough to provide adequate current pinch off when the vertical JFET 100 is turned off. The channel region 108 is coupled to a source region 106 comprising a heavily-doped n-type GaN material.

At least partially surrounding the channel region 108 is a p-type GaN material forming a gate 104 region, which can be coupled to at least a portion of the drift region 103 as shown. The p-type GaN material of the gate 104 and the n-type materials of the channel region 108 and drift region 103 form a p-n junction with corresponding depletion regions 109. It should be noted that for purposes of clarity, depletion regions are not illustrated in FIG. 1. Finally, contacts 102, 105, and 107, formed from one or more layers of electrical conductors including a variety of metals can be provided on the drain 101, gate 104, and source 106, respectively, to electrically couple the vertical JFET 100 to an electrical circuit (not illustrated).

The operation of the vertical JFET 100 is described in additional detail in U.S. patent application Ser. No. 13/198,655, filed on Aug. 24, 2011, the disclosure of which is hereby incorporated by reference in its entirety for all purposes. In summary, the default mode of operation can be normally-off. In the normally-off mode of operation, the depletion regions overlap at a central portion of the channel, preventing current flow through the channel region from the drain to the source. Application of a voltage between the gate contact 105 and source contact 107 results in separation of the depletion regions, allowing current to flow in a vertical direction from the drain 101 through the drift region 103 and channel region 108 to the source 106. Thus, in this embodiment, application of a voltage to the gate 104 turns the vertical JFET on by decreasing the size of the depletion regions and thereby providing a current path through the channel 108.

Figure 2A:
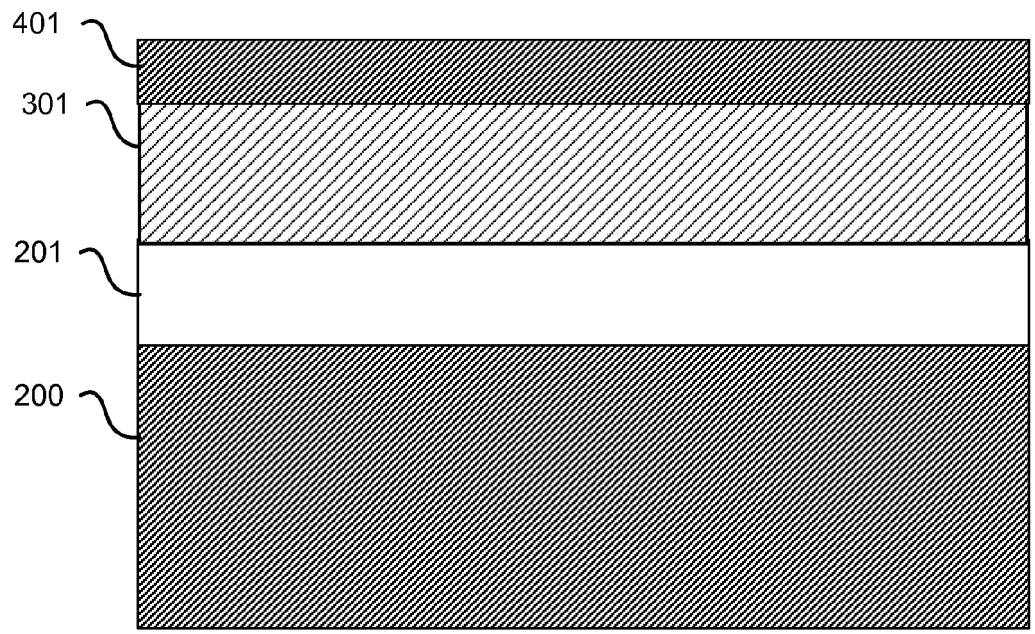
FIGS. 2A-2D are simplified cross-sectional diagrams illustrating the fabrication of a vertical JFET according to an embodiment of the present invention.

FIGS. 2A-2D illustrate a process for creating a planarized vertical JFET according to an embodiment of the present invention. Referring to FIG. 2A, a first GaN epitaxial layer 201 is formed on a GaN substrate 200. As indicated above, the GaN substrate 200 can be a pseudo-bulk GaN material on which the first GaN epitaxial layer 201 is grown. Dopant concentrations (e.g., doping density) of the GaN substrate 200 can vary. For example, a GaN substrate 200 can have an n+ conductivity type, with dopant concentrations ranging from $1\times10^{17}$ cm$^{-3}$ to $1\times10^{19}$ cm$^{-3}$. Although the GaN substrate 200 is illustrated as including a single material composition, multiple layers can be provided as part of the substrate. Moreover, adhesion, buffer, and other layers (not illustrated) can be utilized during the epitaxial growth process. One of ordinary skill in the art would recognize many variations, modifications, and alternatives.

The properties of the first GaN epitaxial layer 201 can also vary, depending on desired functionality. The first GaN epitaxial layer 201 can serve as a drift region for the vertical JFET 100, and therefore can be a relatively low-doped material. For example, the first GaN epitaxial layer 201 can have an n− conductivity type, with dopant concentrations ranging from $1\times10^{14}$ cm$^{-3}$ to $1\times10^{18}$ cm$^{-3}$. Furthermore, the dopant concentration can be uniform, or can vary, for example, as a function of the thickness of the drift region.

The thickness of the first GaN epitaxial layer 201 can also vary substantially, depending on the desired functionality. As discussed above, homoepitaxial growth can enable the first GaN epitaxial layer 201 to be grown far thicker than layers formed using conventional methods. In general, in some embodiments, thicknesses can vary between 0.5 μm and 100 μm, for example, thicknesses greater than 5 μm. Resulting breakdown voltages for the vertical JFET 100 can vary depending on the embodiment. Some embodiments provide for breakdown voltages of at least 100V, 300V, 600V, 1.2 kV, 1.7 kV, 3.3 kV, 5.5 kV, 13 kV, or 20 kV.

Different dopants can be used to create n- and p-type GaN epitaxial layers and structures disclosed herein. For example, n-type dopants can include silicon, oxygen, or the like. P-type dopants can include magnesium, beryllium, zinc, or the like.

FIG. 2A also illustrates the formation of a second GaN epitaxial layer 301 above the first GaN epitaxial layer 201. The second GaN epitaxial layer 301, which eventually comprises the channel of the vertical JFET 100, can have a low dopant concentration. In many embodiments, the dopant concentration of the second GaN epitaxial layer 301 can be equal to or less than the dopant concentration of the first GaN epitaxial layer 201, depending on the desired threshold voltage for the vertical JFET 100. Additionally, the second GaN epitaxial layer 301 can be the same conductivity type as the first GaN epitaxial layer 201. As discussed in relation to the first GaN epitaxial layer 201, and is as applicable to subsequent layers, adhesion layers, buffer layers, and the like, can be utilized during the epitaxial growth as appropriate to the particular device structure fabricated.

The thickness of the second GaN epitaxial layer 301 can also vary depending on the desired functionality. In some embodiments, thicknesses can be between 0.25 μm and 10 μm. In other embodiments, the thickness of the second GaN epitaxial layer 301 can be between 2 μm and 5 μm.

Similar to the first GaN epitaxial layer 201, the dopant concentration of the second GaN epitaxial layer 301 can be uniform or non-uniform. In some embodiments, dopant concentration can vary with the thickness of the second GaN epitaxial layer 301. For example, dopant concentration in the second GaN epitaxial layer 301 can increase as the distance from the first GaN epitaxial layer 201 increases. In other embodiments, the doping may be modulated between two or more values, or undoped regions, resulting in the desired average doping concentration for the layer.

FIG. 2A additionally illustrates the formation of a third GaN epitaxial layer 401 above the second GaN epitaxial layer 301. The third GaN epitaxial layer 401, which eventually can comprise the source of the vertical JFET 100, can be a highly-doped epitaxial layer of the same conductivity type as the first and second GaN epitaxial layers 201, 301. In general, the dopant concentration of the third GaN epitaxial layer 401 can exceed the dopant concentrations of the first and second GaN epitaxial layers 201, 301. For example, an n-type dopant concentration of the third GaN epitaxial layer 401 can be equal to or greater than $1\times10^{18}$ cm$^{-3}$.

The thickness of the third GaN epitaxial layer 401 can impact the contact resistance and current flow properties of the vertical JFET 100. In some embodiments, thicknesses can be between 100 Å and 5 μm, for example 2 μm. In other embodiments, the thickness of the third GaN epitaxial layer 401 can be 0.5 μm, or between 0.3 μm and 0.7 μm.

Figure 2B:
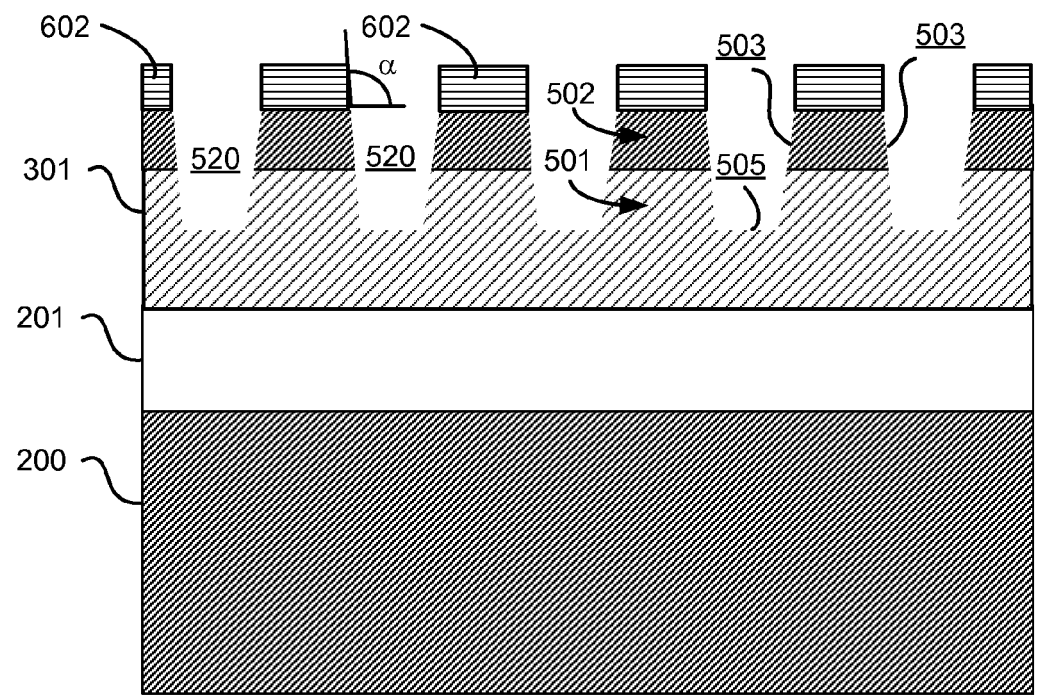

FIG. 2B is a simplified cross-sectional diagram illustrating the removal at least a portion of the second and third epitaxial layers to form the channel region and source region in the process of manufacturing the planarized vertical JFET. The removal process utilizes an etch/regrowth mask 602 that is formed adjacent the upper surface of the third GaN epitaxial layer 401. In some embodiments, the etch/regrowth mask can be applied over adhesion layers or the like as part of a deposition and patterning process. One of ordinary skill in the art would recognize many variations, modifications, and alternatives. The etch/regrowth mask can be fabricated using a variety of materials including dielectrics such as oxides and nitrides or other suitable materials that can be deposited, patterned, withstand etching processes, withstand high temperature regrowth processes, and be removed after processing.

As illustrated in FIG. 2B, at least a portion of the second and third GaN epitaxial layers 301, 401 are removed to form the channel region 501 and source region 502 respectively bounded by the cavities 520. The removal process can be performed by a controlled etch using an etch mask (not shown but having the dimensions of the source region 502). In some embodiments, the removal process is designed to stop at approximately the interface between the second GaN epitaxial layer 301 and the first GaN epitaxial layer 201. In other embodiments, the removal depth varies depending on the particular application. Thus, in other embodiments, the etch or removal process may penetrate portions of the first GaN epitaxial layer 201 and/or fail to remove portions of the second GaN epitaxial layer 301 with negligible impact to the performance of the vertical JFET 100. Inductively-coupled plasma (ICP) etching and/or other common GaN etching processes can be used.

Depending on the processes used to form the channel region 501, the features of the resulting sidewalls 503 of the channel region 501 can vary. In some embodiments, the sidewall 503 can be vertical. In other embodiments, the angle α between the sidewall 503 and a lower surface 505 of the etched features can be greater than 90 degrees, in which case the cross-sectional profile of the channel region 501 and/or the source region 502 can be trapezoidal, as shown in FIG. 2B. An angle α of greater than 90 degrees can facilitate deposition and/or regrowth of subsequent layers and can help improve performance by enabling better control of the electric field near corners. In some embodiments, the removal profile (e.g., the etch profile) can produce a reentrant profile. One of ordinary skill in the art would recognize many variations, modifications, and alternatives.

The width of channel region 501 (e.g., measured at the bottom of the channel) can vary, depending on numerous factors such as desired functionality of the vertical JFET 100, dopant concentrations of channel region 501, as well as other factors. For example, for a normally-off vertical JFET in which the channel region 501 has a dopant concentration between $1 \times 10^{14}$ cm$^{-3}$ and $1 \times 10^{17}$ cm$^{-3}$, the width of the channel region 501 can be between 0.1 μm and 10 μm. In other embodiments, the width of the channel region 501 can be less than 5 μm, less than 3 μm, or the like. For a normally-on vertical JFET, the width of the channel region 501 can be greater.

Figure 2C:
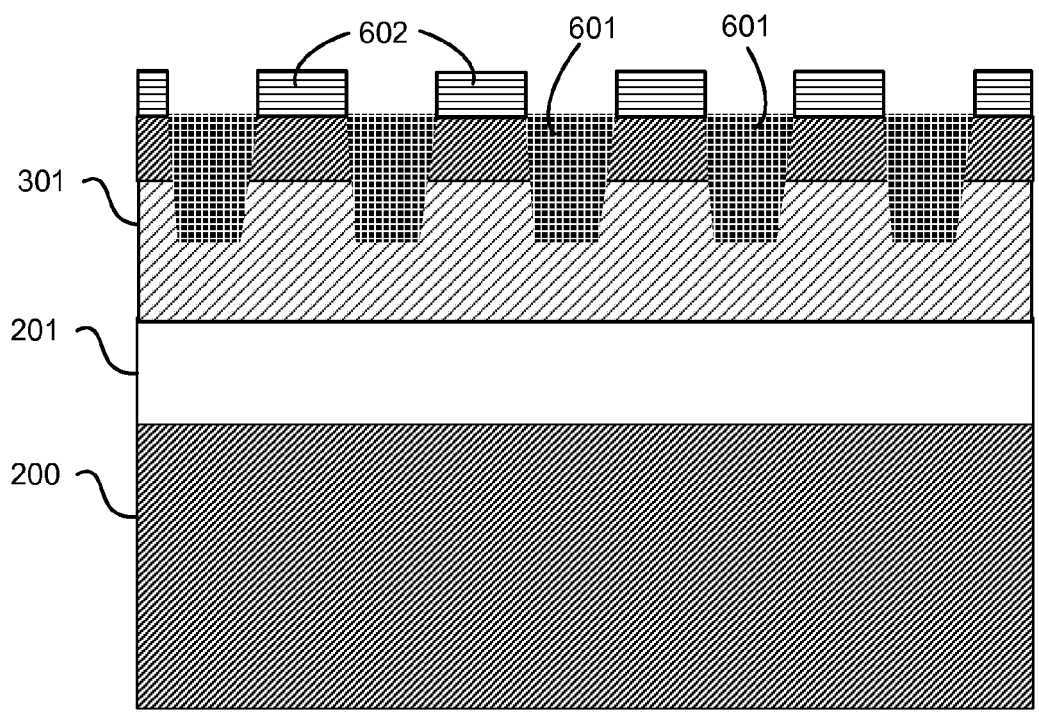

FIG. 2C illustrates the regrowth of epitaxial material 601 for which the upper surface of the regrown material is substantially planar with the upper surface of the source regions 502. The etch/regrowth mask 602 discussed above is illustrated as deposited and/or patterned on an upper surface of the source regions 502 as illustrated in FIG. 2B. The regrown epitaxial material, which is regrown in the cavities 520 will be used to form the gate portions of the vertical JFET 100 and can also be referred to as gate material. The regrown epitaxial material 601 has a conductivity type different than the channel region 501. For instance, if the channel region 501 is formed from an n-type GaN material, the regrown epitaxial material 601 will be formed from a p-type GaN material, and vice versa. In the embodiment illustrated in FIG. 2C, the gate material 601 used to form the gate regions is grown during a selective regrowth process in the cavities with other regions (e.g., regions covered by etch/regrowth mask 602) characterized by reduced or no growth as a result of the presence of the regrowth mask.

Thus, as illustrated in FIG. 2C, the source region 502 is protected during regrowth, enabling electrical contact to the source regions in later processing steps. In other embodiments, the regrowth is continuous over the entire substrate and then portions of the regrown layer are removed to expose the source region 502. One of ordinary skill in the art would recognize many variations, modifications, and alternatives.

The thickness of the gate material 601 is equal to the depth of the cavities 520 and can vary, depending on the process used to form the cavities and the device design. In some embodiments, the thickness of the gate material 601 is between 0.1 μm and 5 μm. In other embodiments, the thickness of the gate material 601 is between 0.3 μm and 1 μm.

The gate material 601 can be highly doped, for example in a range from about $5 \times 10^{17}$ cm$^{-3}$ to about $1 \times 10^{20}$ cm$^{-3}$. Additionally, as with other epitaxial layers, the dopant concentration of the gate material 601 can be uniform or non-uniform as a function of thickness. In some embodiments, the dopant concentration increases with thickness, such that the dopant concentration is relatively low near the first GaN epitaxial layer 201 and channel region 501 and increases as the distance from the first GaN epitaxial layer 201 and channel region 501 increases. Such embodiments provide higher dopant concentrations at the top of the gate material 601 where metal contacts can be subsequently formed. As will be evident to one of skill in the art, other doping profiles can be implanted as appropriate to the particular applications.

One method of forming the gate material 601, and other layers described herein, can be through a regrowth process that uses an in-situ etch and diffusion preparation processes. These preparation processes are described in U.S. patent application Ser. No. 13/198,666, filed on Aug. 4, 2011 and referenced above.

Figure 2D:
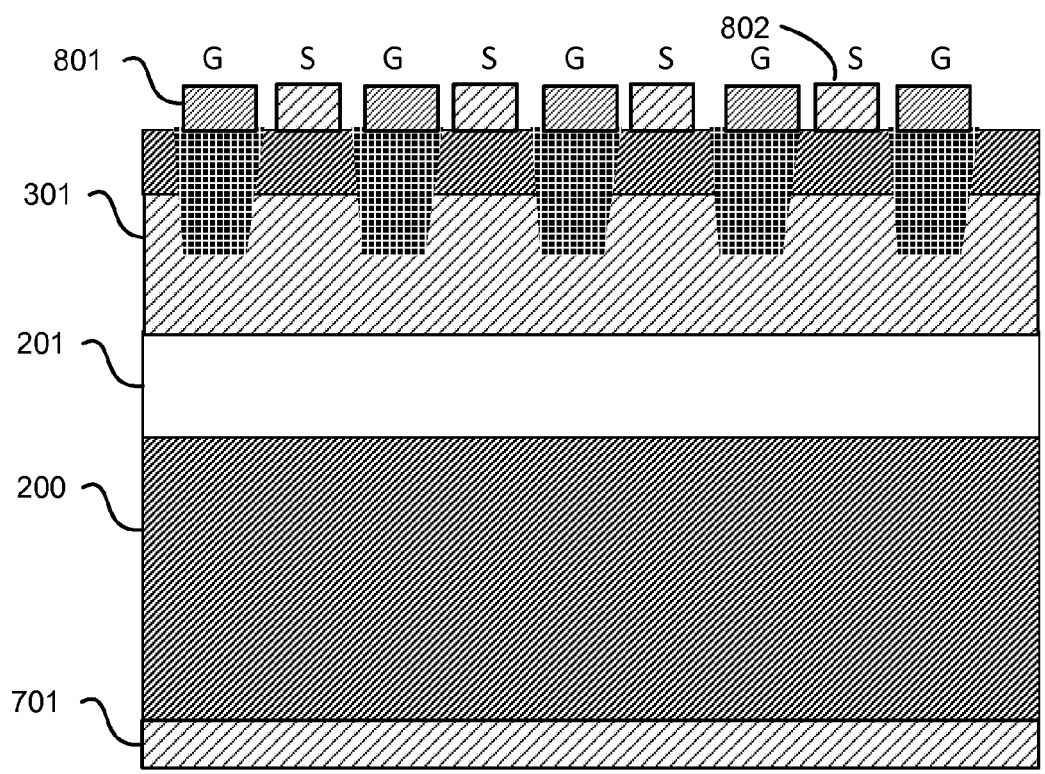

FIG. 2D illustrates the formation of a metallic structure 701 below the GaN substrate 200. The metallic structure 701 can be one or more layers of ohmic metal that serve as a contact for the drain of the vertical JFET 100. For example, the metallic structure 701 can comprise a titanium-aluminum (Ti/Al) ohmic metal. Other metals and/or alloys can be used including, but not limited to, aluminum, nickel, gold, combinations thereof, or the like. In some embodiments, an outermost metal of the metallic structure 701 can include gold, tantalum, tungsten, palladium, silver, or aluminum, combinations thereof, and the like. The metallic structure 701 can be formed using any of a variety of methods such as sputtering, evaporation, or the like.

FIG. 2D also illustrates the formation of additional metallic structures 801 on the regrown areas to serve as the gate contacts of the vertical JFET 100. The additional metallic structures 801 can be one or more layers of ohmic metal including metals and/or alloys similar to the metallic structure 701. The additional metallic structures 801 can be formed using a variety of techniques, including lift-off and/or deposition with subsequent etching, which can vary depending on the metals used. Example metals include nickel-gold (Ni/Au), Pt, Pd, Ni, Au, combinations thereof, and the like.

FIG. 2D also illustrates the formation of further metallic structures 802 on the source regions 502 to serve as the source contacts for the vertical JFET 100. These further metallic structures 802 can be formed using the same techniques used to form the additional metallic structures 801 and also can include similar metals and/or alloys including Al, Ti, Au, Ag, combinations thereof, or the like.

The vertical JFET with planar regrowth gate regions provides numerous benefits in comparison with conventional designs. The planar structure provided by embodiments of the present invention enables the use of high resolution lithography techniques, which are not available for use with non-planar structures as a result, in part, of the depth of field associated with various elements of the devices. Additionally, using the planar regrowth techniques described herein, ohmic contacts to the regrown regions (e.g., gate regions) can be easily fabricated using a variety of metallization processes and can be narrower than in non-planar structures, for which the contact areas are wider. Using narrower gate regions, which is made possible by the planarity of the structure, more of the device area is available for use as the channel and source regions, increasing the current handling capabilities of the JFET or other electronic device as the proportion of the device useful for current channels is increased. Alternatively, the size of the device area can be reduced for a given current handling capability. The reduction of features sizes enables yield improvements for a given device area, reducing fabrication costs. Additionally, the planar structure provided by embodiments of the present invention simplifies the packaging and wire-bonding techniques.

Although the vertical JFET 100 illustrated in FIG. 2D utilizes regrown gate regions, an alternative embodiment provides a vertical JFET that utilizes regrown channel regions. Additional description related to JFETs with regrown channels is provided in U.S. patent application Ser. No. 13/198,659, filed on Aug. 4, 2011, the disclosure of which is hereby incorporated by reference in its entirety. In this alternative embodiment, the epitaxial growth process is modified to provide material suitable for use as the gate regions. The channel regions are then etched or otherwise removed, leaving the gate regions intact. A selective regrowth process is used to regrow the channel regions and source regions, providing a planar regrowth process for which the top surface of the regrown material is substantially planar with the upper surface of the gate regions. One of ordinary skill in the art would recognize many variations, modifications, and alternatives.

Moreover, although a vertical JFET with regrown gate regions is illustrated in FIG. 2D, and a vertical JFET with regrown channel regions is discussed above, embodiments of the present invention are not limited to these particular electronic devices. Other embodiments provide electronic structures with regrown regions that have regrowth surfaces that are substantially planar with the materials that provide the underlying support for the regrown material. Thus, recessed regions in epitaxial or other materials can be filled to provide a planar upper surface including both as-grown and regrown materials. In contrast with some regrowth techniques that regrown insulating materials such as dielectrics, embodiments of the present invention provide regrown regions that conduct electric current, enabling the fabrication of devices that utilize the regrown regions for conducting current, applying electrical bias, or the like.

Figure 3:
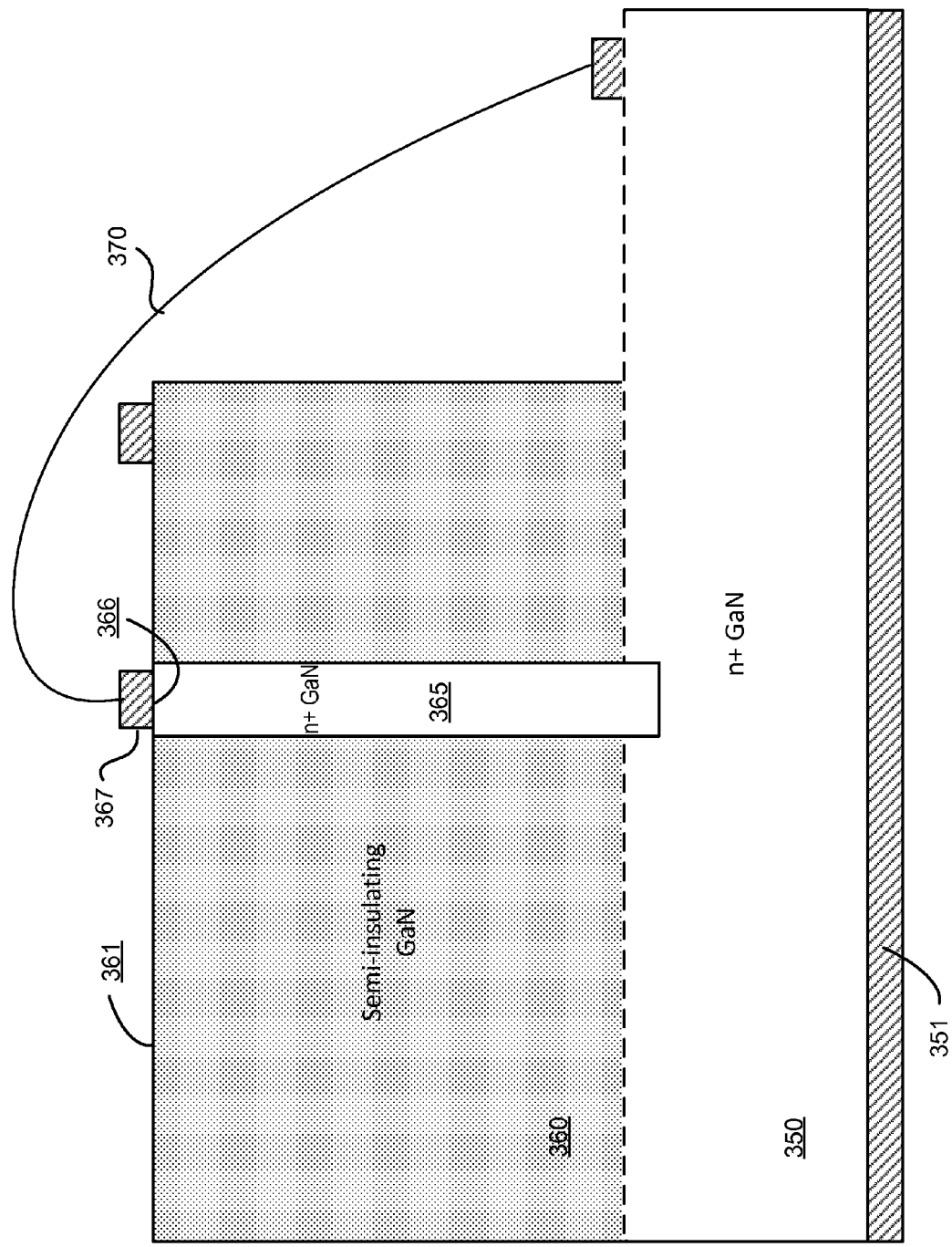
FIG. 3 is a simplified schematic diagram illustrating a planar regrown contact structure according to an embodiment of the present invention.

FIG. 3 is a simplified schematic diagram illustrating a planar regrown contact structure according to an embodiment of the present invention. As illustrated in FIG. 3, a substrate layer 350 is provided, with a metallization layer (i.e., a contact layer) 351 coupled to the substrate layer. A semi-insulating epitaxial layer (e.g., an undoped GaN layer) 360 is coupled to the substrate layer. Suitable adhesion, buffer, and other layers (not illustrated) can be utilized during the epitaxial growth process. One of ordinary skill in the art would recognize many variations, modifications, and alternatives. The semi-insulating layer 360 has an upper surface 361 that is substantially planar.

In order to provide for electrical contact from an upper surface 361 of the semi-insulating epitaxial layer 360 to the to the substrate layer 350, a regrown conductive plug 365 is regrown as illustrated in FIG. 3. Formation of an etch/regrowth mask, etching of the via for the plug, as well as the regrowth process is not illustrated for purposes of clarity and conciseness. In the illustrated embodiment, the regrown conductive plug 365 is a heavily doped (i.e., n+) GaN material that provides a conductive path from electrode 367 to the underlying substrate. Utilizing the methods and systems described herein, the regrowth process results in a planar regrowth surface in which the upper surface 366 of the regrown conductive plug 365 lies in substantially the same plane as the upper surface 361 of the semi-insulating layer 360. The planar regrown conductive plug 365 can provide an integrated conductive path to a ground plane from the surface of the epitaxial layer that is integrated into the structure, which is a superior approach to the alternative wirebond connection 370 illustrated in FIG. 3 since the inductance of the wire is reduced or eliminated.

By providing a planar surface as a result of the regrowth process, a number of processing steps are facilitated, the process for formation of the contact electrodes for the gate and source contacts is improved since lithography on planar surfaces is provided, among other benefits.

Figure 4:
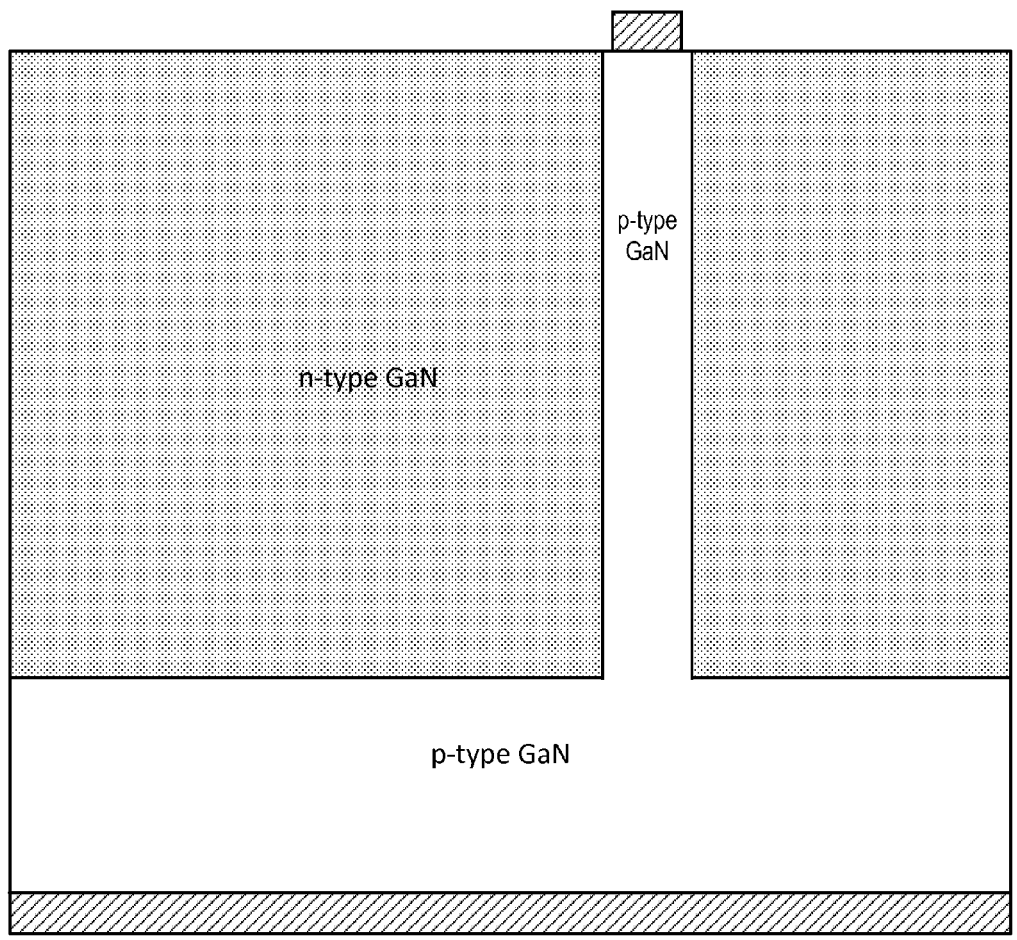
FIG. 4 is a simplified schematic diagram illustrating a planar regrown resistor structure according to an embodiment of the present invention.

FIG. 4 is a simplified schematic diagram illustrating a planar regrown resistor structure according to an embodiment of the present invention. As illustrated in FIG. 4, an n-type III-nitride epitaxial layer (e.g., an n-type GaN-based layer) is coupled to a p-type III-nitride substrate (e.g., a GaN-based substrate). A p-type III-nitride material is regrown in a recess extending into the n-type epitaxial layer. In the embodiment, the recess extends through the thickness of the n-type epitaxial layer, providing for exposure of the underlying substrate prior to the regrowth process. The regrown p-type material has an upper surface that is substantially coplanar with the upper surface of the n-type epitaxial layer. The structure illustrated in FIG. 4 provides an integrated resistor using the regrown resistive plug.

In an alternative embodiment, the integrated resistive plug can be n-type, either regrown in p-type material or regrown in semi-insulating material (e.g., semi-insulating GaN). In other embodiments, the epitaxial layer in which the recesses for regrowth are formed is semi-insulating, p-type, or the like). The resistive plug fabricating using a planarized regrowth process and illustrated in FIG. 4 can provide a number of electrical functions, including impedance matching, integration into electronic circuits, or the like.

Figure 5:
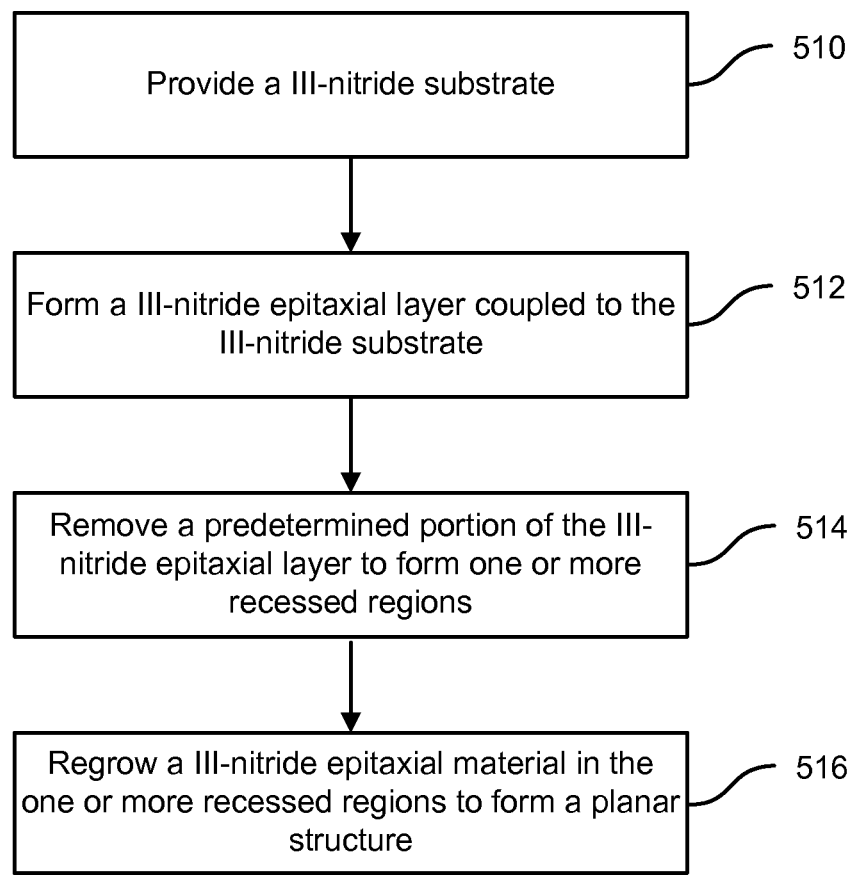
FIG. 5 is a simplified flowchart illustrating a method of fabricating an electronic device according to an embodiment of the present invention.

FIG. 5 is a simplified flowchart illustrating a method of fabricating an electronic device according to an embodiment of the present invention. In some embodiments, the electronic device is a vertical JFET or other controlled switching device, although embodiments of the present invention are not limited to these particular devices. Referring to FIG. 5, a III-nitride substrate is provided (510). In an embodiment, the III-nitride is an n-type GaN substrate. The method also includes forming a III-nitride epitaxial layer (e.g., an n-type GaN epitaxial layer) coupled to the III-nitride substrate (512). The III-nitride epitaxial layer has an upper surface and is characterized by a first dopant concentration, for example n-type doping. Using the homoepitaxy techniques described herein, the thickness of the first III-nitride epitaxial layer can be thicker than available using conventional techniques, for example, between about 3 μm and about 100 μm, more particularly, between about 1 μm and 80 μm.

The method further includes forming a removing a predetermined portion of the III-nitride epitaxial layer to form one or more recessed regions extending from the upper surface of the III-nitride epitaxial layer to a predetermined depth. In an embodiment, the predetermined depth is less than the thickness. The removal process can include a masking and etching process that can include physical etching components as well as chemical etching components. Additionally, the method includes regrowing a III-nitride epitaxial material in the one or more recessed regions. The regrown III-nitride epitaxial material has an upper regrowth surface substantially coplanar with the upper surface. In some embodiments, the regrown material comprises a p-type GaN epitaxial material, for example, used in fabrication of gate regions for a JFET.

In an alternative embodiment, the method also includes forming a first electrical contact to a contact region of the upper surface of the III-nitride epitaxial layer and forming a second electrical contact to a contact region of the upper regrowth surface. Thus, in some embodiments, the regrown material provides for conduction of electrical current, application of bias to other device regions, or the like. Although the III-nitride epitaxial layer is discussed in terms of a single layer, this is not required by embodiments of the present invention and the various epitaxial layers, including the regrown epitaxial material, can include sub-layers. As an example, the III-nitride layer can include a plurality of sub-layers such as a drift sub-layer, a channel sub-layer, and a source sub-layer. Thus, in these embodiments, complex epitaxial structures are provided including both multiple epitaxial layers and/or multiple layers of regrown material.

A first metallic structure can be electrically coupled to the III-nitride substrate, a second metallic structure can be electrically coupled to the III-nitride epitaxial layer, and a third metallic structure can be electrically coupled to the regrown material. Thus, in addition to electrical connectivity to the as-grown material, electrical connectivity can be provided to the regrown material. It should be noted that the various epitaxial layers, both as-grown and regrown, do not have to be uniform in dopant concentration as a function of thickness, but may utilize varying doping profiles as appropriate to the particular application.

It should be appreciated that the specific steps illustrated in FIG. 5 provide a particular method of fabricating an electronic device according to an embodiment of the present invention. Other sequences of steps may also be performed according to alternative embodiments. For example, alternative embodiments of the present invention may perform the steps outlined above in a different order. Moreover, the individual steps illustrated in FIG. 5 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 6:
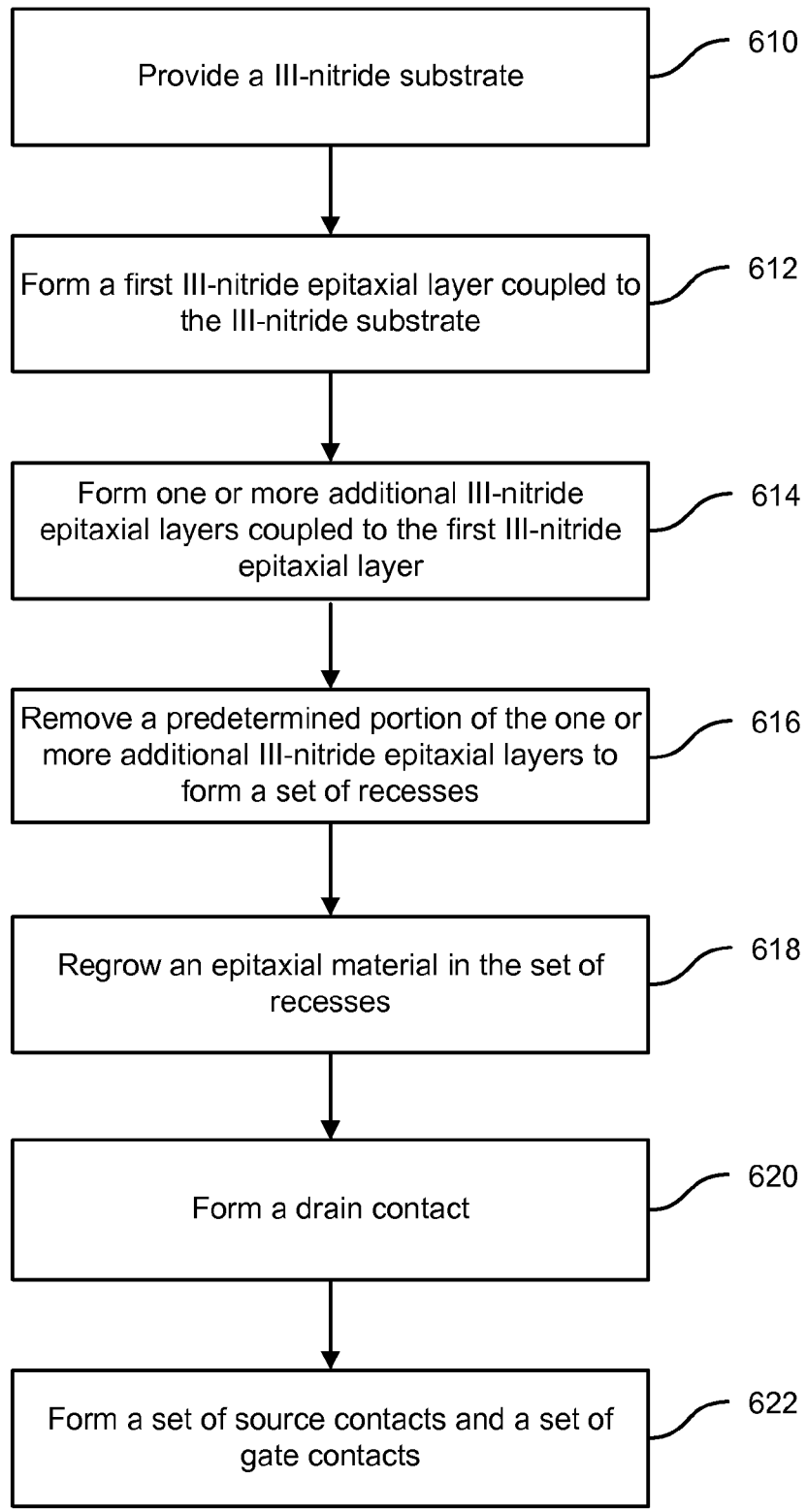
FIG. 6 is a simplified flowchart illustrating a method of fabricating a vertical JFET with regrown gate regions according to an embodiment of the present invention.

FIG. 6 is a simplified flowchart illustrating a method of fabricating a vertical JFET with regrown gate regions according to an embodiment of the present invention. In some embodiments, the vertical JFET is referred to as a controlled switching device. Referring to FIG. 6, a III-nitride substrate is provided (610). In an embodiment, the III-nitride is an n-type GaN substrate. The method also includes forming a first III-nitride epitaxial layer (e.g., an n-type GaN epitaxial layer) coupled to the III-nitride substrate (612). The first III-nitride epitaxial layer is characterized by a first dopant concentration, for example n-type doping. Using the homoepitaxy techniques described herein, the thickness of the first III-nitride epitaxial layer can be thicker than available using conventional techniques, for example, between about 3 μm and about 100 μm, more particularly, between about 1 μm and 80 μm, as appropriate to high power operation.

The method further includes forming one or more additional III-nitride epitaxial layers (e.g., a GaN-based channel layer and a GaN-based source layer) coupled to the first III-nitride epitaxial layer (614).

The method further includes removing at least a portion of the one or more III-nitride epitaxial layers to form a set of recesses extending a predetermined distance into the one or more additional III-nitride epitaxial layers (616). The set of recesses are disposed between remaining portions of the one or more additional III-nitride epitaxial layers. The removal process can include a masking and etching process that can include physical etching components as well as chemical etching components. The method also includes regrowing an epitaxial material in the set of recesses (618). The regrown epitaxial material can form a set of gate regions interspersed between and/or at least partially surrounding channel regions associated with the remaining portions of the one or more additional epitaxial layers. In some embodiments, the regrown material has a conductivity type the opposite of the conductivity type of the one or more additional III-nitride epitaxial layers. The epitaxial material has a thickness substantially equal to the predetermined distance, providing a planar regrowth surface including an upper surface of the remaining portions of the one or more additional epitaxial layers and an upper surface of the regrown epitaxial material.

The method further includes forming a drain contact electrically coupled to the III-nitride substrate (620) and forming a set of source contacts electrically coupled to the remaining portions of the one or more additional III-nitride epitaxial layers and forming a set of gate contacts electrically coupled to the epitaxial material (622). The various epitaxial layers do not have to be uniform in dopant concentration as a function of thickness, but may utilize varying doping profiles as appropriate to the particular application.

It should be appreciated that the specific steps illustrated in FIG. 6 provide a particular method of fabricating a vertical JFET with regrown gate regions according to an embodiment of the present invention. Other sequences of steps may also be performed according to alternative embodiments. For example, alternative embodiments of the present invention may perform the steps outlined above in a different order. Moreover, the individual steps illustrated in FIG. 6 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:
1. A vertical JFET comprising:
a III-nitride substrate; and
a III-nitride epitaxial structure coupled to the III-nitride substrate, wherein the III-nitride epitaxial structure comprises:

a plurality of channels of a first conductivity type, wherein each of the channels comprises an interface surface, a plurality of sources of the first conductivity type, wherein each of the sources comprises a contact surface contacting an interface surface of the channels, and a plurality of epitaxially grown gates interleaved with the channels, wherein an upper surface of the gates is substantially coplanar with the contact surfaces of the sources.

2. The vertical JFET of claim 1, further comprising:

a plurality of source contacts, wherein each source contact is electrically coupled to one of the sources; and a plurality of gate contacts, wherein each gate contact is electrically coupled to one of the regrown gates.

3. The vertical JFET of claim 1, further comprising a drain contact electrically coupled to the III-nitride substrate.

4. The vertical JFET of claim 1, wherein the first conductivity type is n type and the gates are p type.

5. The vertical JFET of claim 1, wherein the channels are disposed between the gates such that current flow during operation of the vertical JFET is along a direction orthogonal to the upper surface of the set of regrown gates.

6. The vertical JFET of claim 1, wherein the III-nitride substrate comprises an n-type substrate.

7. The vertical JFET of claim 1, wherein a width of the channels measured along a direction orthogonal to a thickness of the III-nitride epitaxial layer is less than 5 μm.

8. The vertical JFET of claim 1, wherein the gates comprise a p-type III-nitride material.

9. The vertical JFET of claim 1, wherein the gates are further electrically coupled to a drift region.

10. The vertical JFET of claim 1, wherein the channels have a first dopant concentration and the gates have a second dopant concentration.

11. The vertical JFET of claim 10, wherein at least one of the first dopant concentration and the second dopant concentration is non-uniform.

12. A method of manufacturing a vertical JFET, the method comprising:

providing a III-nitride substrate; and forming a III-nitride epitaxial structure on the III-nitride substrate, wherein the III-nitride epitaxial structure comprises:

a plurality of channels of a first conductivity type, wherein each of the channels comprises an interface surface, a plurality of sources of the first conductivity type, wherein each of the sources comprises a contact surface contacting an interface surface of the channels, and a plurality of epitaxially grown gates interleaved with the channels, wherein an upper surface of the gates is substantially coplanar with the contact surfaces of the sources.

13. The method of claim 12, further comprising:

forming a plurality of source contacts, wherein each source contact is electrically coupled to one of the sources; and forming a plurality of gate contacts, wherein each gate contact is electrically coupled to one of the regrown gates.

14. The method of claim 12, further comprising forming a drain contact electrically coupled to the III-nitride substrate.

15. The method of claim 12, wherein the first conductivity type is n type and the gates are p type.

16. The method of claim 12, wherein the channels are disposed between the gates such that current flow during operation of the vertical JFET is along a direction orthogonal to the upper surface of the set of regrown gates.

17. The method of claim 12, wherein the III-nitride substrate comprises an n-type substrate.

18. The method of claim 12, wherein a width of the channels measured along a direction orthogonal to a thickness of the III-nitride epitaxial layer is less than 5 μm.

19. The method of claim 12, wherein the gates comprise a p-type III-nitride material.

20. The method of claim 12, wherein the gates are further electrically coupled to a drift region.

21. The method of claim 12, wherein the channels have a first dopant concentration and the gates have a second dopant concentration.

22. The method of claim 21, wherein at least one of the first dopant concentration and the second dopant concentration is non-uniform.

* * * * *